(12) United States Patent
Ishijima et al.

(10) Patent No.: US 11,884,844 B2
(45) Date of Patent: Jan. 30, 2024

(54) COMPOSITION FOR POST-POLISHING TO BE USED AFTER PRIMARY POLISHING OF SILICON WAFERS

(71) Applicant: NISSAN CHEMICAL CORPORATION, Tokyo (JP)

(72) Inventors: Hibiki Ishijima, Funabashi (JP); Eiichiro Ishimizu, Funabashi (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 18/038,252

(22) PCT Filed: Oct. 6, 2022

(86) PCT No.: PCT/JP2022/037451
§ 371 (c)(1),
(2) Date: May 23, 2023

(87) PCT Pub. No.: WO2023/063213
PCT Pub. Date: Apr. 20, 2023

(65) Prior Publication Data
US 2023/0416569 A1 Dec. 28, 2023

(30) Foreign Application Priority Data
Oct. 14, 2021 (JP) .................................. 2021-168563

(51) Int. Cl.
*C09G 1/02* (2006.01)
(52) U.S. Cl.
CPC ..................................... *C09G 1/02* (2013.01)
(58) Field of Classification Search
None
See application file for complete search history.

(56) References Cited

U.S. PATENT DOCUMENTS

| 2016/0189973 A1 | 6/2016 | Tabata et al. |
| 2019/0249122 A1 | 8/2019 | Uchida |
| 2020/0317955 A1 | 10/2020 | Ishimizu et al. |
| 2022/0049126 A1 | 2/2022 | Yamaguchi et al. |
| 2022/0186078 A1* | 6/2022 | Tsuchiya .............. C09K 3/1463 |

FOREIGN PATENT DOCUMENTS

| JP | 2017-183359 A | 10/2017 |
| JP | 2018-078287 A | 5/2018 |
| JP | 2019-186346 A | 10/2019 |
| JP | 2020-035870 A | 3/2020 |
| JP | 2021-106246 A | 7/2021 |
| WO | 2015/019706 A1 | 2/2015 |
| WO | 2017/110315 A1 | 6/2017 |
| WO | 2019/124442 A1 | 6/2019 |
| WO | 2021/065815 A1 | 4/2021 |

OTHER PUBLICATIONS

Nov. 22, 2022 International Search Report issued in International Patent Application No. PCT/JP2022/037451.
Nov. 22, 2022 Written Opinion issued in International Patent Application No. PCT/JP2022/037451.

* cited by examiner

*Primary Examiner* — Roberts P Culbert
(74) *Attorney, Agent, or Firm* — Oliff PLC

(57) ABSTRACT

A polishing composition used in wafer polishing process for eliminating protrusion around laser mark, thereby achieving a flat polished surface, as well as a wafer polishing method using the polishing composition. A post-polishing composition for elimination of a laser mark remaining after polishing of silicon wafer with a primary polishing composition containing silica particles, water, and a basic compound, the post-polishing composition including silica particles, water, a tetraalkylammonium ion, and a water-soluble polymer, wherein the mass ratio of the tetraalkylammonium ion to $SiO_2$ of the silica particles is 0.200 to 1.000:1; the mass ratio of $SiO_2$ dissolved in the polishing composition to $SiO_2$ of the silica particles is 0.100 to 1.500:1; and the mass ratio of the water-soluble polymer to $SiO_2$ of the silica particles is 0.005 to 0.05:1. The silica particles have an average primary particle diameter of 1 nm to 100 nm.

12 Claims, No Drawings

_US 11,884,844 B2_

COMPOSITION FOR POST-POLISHING TO BE USED AFTER PRIMARY POLISHING OF SILICON WAFERS

TECHNICAL FIELD

The present invention relates to a polishing composition used for polishing the surface of a wafer. Particularly, the present invention relates to a post-polishing composition used in a wafer polishing process after primary polishing for achieving a flat polished surface having no level difference at the periphery of a wafer (which may be referred to as, for example, "laser mark portion").

BACKGROUND ART

A silicon wafer used for a semiconductor product is finished to have a mirror surface by a lapping process (rough polishing process) and a polishing process (precise polishing process). The polishing process includes a preliminary polishing process and a final polishing process.

For the purpose of, for example, identification, a silicon wafer may be provided with a mark (laser mark) such as a barcode, a numeral, or a symbol by irradiating the surface of the silicon wafer with laser light. In general, a silicon substrate is provided with such a laser mark after completion of a lapping process for the substrate and before initiation of a polishing process therefor. The laser light irradiation for providing the laser mark generally causes a protrusion (bump) on the silicon wafer surface around the laser mark. The laser mark portion of the silicon wafer is not used for a final product. However, when the aforementioned protrusion is not appropriately eliminated in the polishing process after provision of the laser mark, the yield of the product may be reduced to a level lower than expected. Thus, it is desired to appropriately eliminate the protrusion around the laser mark in a preliminary polishing process.

The phrase "elimination of a protrusion around a laser mark" as used herein refers to a decrease in the peak height of a protrusion as measured from a reference plane (horizontal plane) around a laser mark of a wafer.

Patent Document 1 proposes a method for producing a polished polishing object, wherein the method is intended to reduce the height of a laser mark.

Patent Document 2 proposes a polishing composition and a method for polishing a silicon substrate with the polishing composition, wherein the method is intended to reduce irregularities caused by a protrusion generated around a hard laser mark.

Patent Document 3 proposes a polishing method that is intended to eliminate a protrusion around a hard laser mark.

Patent Document 4 discloses a rinse agent composition for a silicon wafer, the composition containing a water-soluble polymer, silica particles, water, and, if necessary, hydrochloric acid or ammonia.

Patent Document 5 discloses a silicon wafer polishing method including a process of polishing a to-be-polished silicon wafer with a polishing liquid composition containing silica particles, a water-soluble polymer B, a nitrogen-containing basic compound, and an aqueous medium; a rinsing process in which the polished silicon wafer is rinsed with a rinse agent composition containing a water-soluble polymer A and an aqueous medium; and a process of washing the rinsed silicon wafer.

Patent Document 6 discloses a polishing composition containing silica particles and water, characterized in that the polishing composition further contains a tetraalkylammonium ion such that the mass ratio of the tetraalkylammonium ion to $SiO_2$ of the silica particles is 0.400 to 1.500:1, and the mass ratio of $SiO_2$ dissolved in the polishing composition to $SiO_2$ of the silica particles is 0.100 to 1.500:1. This patent document describes that the polishing composition is used as a polishing agent for elimination of a laser mark of a silicon wafer.

PRIOR ART DOCUMENTS

Patent Documents

Patent Document 1: WO 2015/019706
Patent Document 2: WO 2017/110315
Patent Document 3: JP 2017-183359 A
Patent Document 4: JP 2018-078287 A
Patent Document 5: JP 2019-186346 A
Patent Document 6: WO 2021/065815

SUMMARY OF THE INVENTION

Problems to be Solved by the Invention

The present invention provides a polishing composition used in a wafer polishing process for eliminating a protrusion around a laser mark, thereby achieving a flat polished surface, as well as a wafer polishing method using the polishing composition.

Means for Solving the Problems

A first aspect of the present invention is a post-polishing composition for elimination of a laser mark remaining after polishing of a silicon wafer with a primary polishing composition containing silica particles, water, and a basic compound, the post-polishing composition comprising silica particles, water, a tetraalkylammonium ion, and a water-soluble polymer, wherein the mass ratio of the tetraalkylammonium ion to $SiO_2$ of the silica particles is 0.200 to 1.000:1: the mass ratio of $SiO_2$ dissolved in the post-polishing composition to $SiO_2$ of the silica particles is 0.100 to 1.500:1; and the mass ratio of the water-soluble polymer to $SiO_2$ of the silica particles is 0.005 to 0.05:1.

A second aspect of the present invention is the post-polishing composition according to the first aspect, wherein the tetraalkylammonium ion is derived from a compound selected from the group consisting of an alkali silicate, a hydroxide, a carbonate, a sulfate, and a halide, and the tetraalkylammonium ion is contained in the post-polishing composition in an amount of 0.2% by mass to 8.0% by mass.

A third aspect of the present invention is the post-polishing composition according to the first aspect, wherein the dissolved $SiO_2$ is derived from tetraalkylammonium silicate, potassium silicate, sodium silicate, or a mixture of any of these, and the dissolved $SiO_2$ is contained in the post-polishing composition in an amount of 0.1% by mass to 8.0% by mass.

A fourth aspect of the present invention is the post-polishing composition according to any one of the first to third aspects, wherein the dissolved $SiO_2$ is silica having an average primary particle diameter of less than 1 nm, or a silicate anion.

A fifth aspect of the present invention is the post-polishing composition according to any one of the first to fourth aspects, wherein the tetraalkylammonium ion is a tetramethylammonium ion, a tetraethylammonium ion, a tetrapropylammonium ion, a tetrabutylammonium ion, an ethyltrimethylammonium ion, a diethyldimethylammonium ion, a methyltriethylammonium ion, or a mixture of any of these.

A sixth aspect of the present invention is the post-polishing composition according to any one of the first to fifth aspects, wherein the silica particles have an average primary particle diameter of 1 nm to 100 nm, and the post-polishing composition has a silica concentration based on the silica particles of 0.1% by mass to 30% by mass.

A seventh aspect of the present invention is the post-polishing composition according to any one of the first to sixth aspects, wherein the post-polishing composition has a pH of 9 to 13.

An eighth aspect of the present invention is the post-polishing composition according to any one of the first to seventh aspects, wherein the water-soluble polymer has an average molecular weight of 5,000 to 2,000,000 and contains an amino group, a hydroxyl group, a sulfonate group, or a carboxyl group in the molecule.

A ninth aspect of the present invention is the post-polishing composition according to the eighth aspect, wherein the water-soluble polymer is poly-N-vinylacetamide, polyvinylpyrrolidone, polyvinyl alcohol, hydroxyethyl cellulose, hydroxypropyl cellulose, hydroxymethyl propyl cellulose, or carboxymethyl cellulose.

A tenth aspect of the present invention is the post-polishing composition according to any one of the first to ninth aspects, wherein the polishing is for elimination of a laser mark of a silicon wafer.

An eleventh aspect of the present invention is a silicon wafer polishing method comprising the following step (A) and step (B):

step (A): a step of polishing a silicon wafer with a primary polishing composition containing silica particles, water, and a basic compound; and step (B): a step of polishing the silicon wafer with the post-polishing composition according to any one of the first to tenth aspects in place of the polishing composition used in the step (A).

A twelfth aspect of the present invention is the polishing method according to the eleventh aspect, wherein the step (A) and the step (B) are performed in the same polishing apparatus; the polishing composition is supplied by a circulation polishing process in the step (A), and by a circulation polishing process or a pouring polishing process in the step (B); and the polishing time in the step (B) is ½ or less of the polishing time in the step (A).

Effects of the Invention

When a wafer is polished with the post-polishing composition of the present invention, the post-polishing composition exhibits the effect of eliminating a protrusion around a laser mark to thereby achieve a flat polished surface.

The post-polishing composition of the present invention is used for secondary rough polishing after primary rough polishing, and the use of the post-polishing composition of the present invention can eliminate (by polishing) a protrusion of a laser mark portion that cannot be completely polished by the primary rough polishing.

Before the primary polishing, both the surface of a silicon wafer and a protrusion around a laser mark at the periphery of the wafer are polished with the same polishing agent. The primary polishing of the silicon wafer is performed by a circulation polishing process, and a polishing liquid containing a polishing composition is supplied to the silicon wafer in a circulation mode during the polishing process.

As clarified in the present invention, incorporation of a specific amount of a water-soluble polymer is required in order to improve affinity with a protrusion around a laser mark for elimination of the protrusion. However, a water-soluble polymer has low polishing resistance, and thus the friction between a silicon wafer and a polishing pad may commonly cause degradation of the water-soluble polymer, resulting in deterioration of its original function.

In the present invention, a silicon wafer can be polished with a primary polishing composition (i.e., a polishing composition containing silica particles, water, and a basic compound) and then with a post-polishing composition (i.e., a polishing composition containing silica particles, water, a tetraalkylammonium ion, and a water-soluble polymer), to thereby eliminate a protrusion around a laser mark. Although the primary polishing composition may contain a water-soluble polymer, the water-soluble polymer may degrade through a circulation polishing process and is less likely to exhibit its original function in a post-polishing process.

In the present invention, the post-polishing composition is used after the primary polishing, and thus a portion around a laser mark that is insufficiently polished by the primary polishing can be polished with the post-polishing composition within a shorter time than the primary polishing.

The post-polishing composition contains silica particles, water, a tetraalkylammonium ion, and a water-soluble polymer, wherein the mass ratio of the tetraalkylammonium ion to $SiO_2$ of the silica particles is 0.200 to 0.000:1; the mass ratio of $SiO_2$ dissolved in the polishing composition to $SiO_2$ of the silica particles is 0.100 to 1.500:1; and the mass ratio of the water-soluble polymer to $SiO_2$ of the silica particles is 0.005 to 0.05:1. Thus, the post-polishing composition can polish a protrusion of a laser mark portion that cannot be sufficiently polished through the primary polishing, to thereby achieve a flat surface.

MODES FOR CARRYING OUT THE INVENTION

The present invention is directed to a post-polishing composition for elimination of a laser mark remaining after polishing of a silicon wafer with a primary polishing composition containing silica particles, water, and a basic compound. The post-polishing composition contains silica particles, water, a tetraalkylammonium ion, and a water-soluble polymer, wherein the mass ratio of the tetraalkylammonium ion to $SiO_2$ of the silica particles is 0.200 to 1.000:1 or 0.400 to 1.000:1, the mass ratio of $SiO_2$ dissolved in the polishing composition to $SiO_2$ of the silica particles is 0.100 to 1.500:1; and the mass ratio of the water-soluble polymer to $SiO_2$ of the silica particles is 0.005 to 0.05:1.

The silica particles contained in the post-polishing composition of the present invention may be in the form of an aqueous dispersion of silica particles having an average primary particle diameter of 1 nm to 100 nm. Such an aqueous dispersion is a silica sol, and the silica contained in the silica sol corresponds to the silica particles contained in the post-polishing composition of the present invention. The aqueous medium in the silica sol may be replaced with water contained in the polishing composition. The water contained in the polishing composition is derived from water in the silica sol. In addition, water may be further added for dilution of the polishing composition.

The silica particles used in the present invention are colloidal silica having an average primary particle diameter of 1 nm to 100 nm as determined by the nitrogen adsorption method. Silica particles having an average primary particle diameter of less than 1 nm cause a reduction in polishing rate, and the silica particles are likely to aggregate, resulting in poor stability of the resultant polishing composition. Silica particles having an average primary particle diameter of more than 100 nm are likely to generate scratches on the surface of a wafer, and cause poor planarity of the polished surface.

When coarse particles having a diameter of 0.5 μm or more are contained in a silica sol prepared by dispersion of silica particles in an aqueous medium, the coarse particles are preferably removed. The coarse particles can be removed by the forced precipitation method or the microfiltration method. The filter used for the microfiltration may be any of, for example, a depth filter, a pleated filter, a membrane filter, and a hollow fiber filter. The material of such a filter may be any of, for example, cotton, polypropylene, polystyrene, polysulfone, polyethersulfone, nylon, cellulose, and glass. The filtration accuracy of a filter is represented by absolute filtration accuracy (size of particles trapped 99.9% or more). The aforementioned silica particles are preferably treated with a filter having an absolute filtration accuracy of 0.5 μm to 1.0 μm, from the viewpoint of production efficiency (e.g., treatment time or the degree of filter clogging).

The pH of a silica sol may be adjusted with, for example, ammonia, and a polymer, a chelating agent, etc. may be added to the silica sol. The pH adjustment of the silica sol may be performed before, after, or before and after addition of the compound (polymer) or the chelating agent.

The pH of the post-polishing composition of the present invention can be adjusted to fall within a range of 9 to 13, 10 to 13, or 10 to 12. Preferably, the pH is adjusted to fall within the aforementioned range before polishing.

The alkaline component used for such pH adjustment may be an aqueous solution of, for example, sodium hydroxide, potassium hydroxide, ammonia, primary ammonium hydroxide, secondary ammonium hydroxide, tertiary ammonium hydroxide, quaternary ammonium hydroxide (e.g., tetraalkylammonium hydroxide), an organic amine, or an alkali metal carbonate. In particular, an aqueous solution of sodium hydroxide or potassium hydroxide, or an aqueous solution of tetraalkylammonium hydroxide is preferably used.

Examples of the tetraalkylammonium hydroxide include tetramethylammonium hydroxide, tetraethylammonium hydroxide, tetrapropylammonium hydroxide, tetrabutylammonium hydroxide, ethyltrimethylammonium hydroxide, diethyldimethylammonium hydroxide, and methyltriethylammonium hydroxide. In particular, tetramethylammonium hydroxide is preferably used.

The post-polishing composition of the present invention contains a tetraalkylammonium ion and $SiO_2$ dissolved in the polishing composition, and the tetraalkylammonium ion and the dissolved $SiO_2$ form an alkali silicate.

The tetraalkylammonium ion contained in the post-polishing composition of the present invention is, for example, a tetraalkylammonium ion having a total carbon atom number of 4 to 40 or 4 to 20. Examples of such a tetraalkylammonium ion include a tetramethylammonium ion, a tetraethylammonium ion, a tetrapropylammonium ion, a tetrabutylammonium ion, an ethyltrimethylammonium ion, a diethyldimethylammonium ion, a methyltriethylammonium ion, or a mixture of any of these.

The aforementioned tetraalkylammonium ion is derived from a compound selected from the group consisting of an alkali silicate, a hydroxide, a carbonate, and a halide. The post-polishing composition of the present invention may contain the tetraalkylammonium ion such that the mass ratio of the tetraalkylammonium ion to $SiO_2$ of the silica particles is 0.200 to 1.000:1 or 0.400 to 1.000:1.

The dissolved $SiO_2$ (hereinafter may be referred to as, for example, "dissolved silica") is a silica component having no particulate property and being dissolved in an aqueous medium of the polishing composition. The centrifugal filtration of the polishing composition can separate silica particles from the dissolved $SiO_2$. The dissolved $SiO_2$ is difficult to determine through observation with a transmission electron microscope, and thus the dissolved $SiO_2$ probably has no particulate property or has an average primary particle diameter of less than 1 nm even when, for example, an oligomer is present. Thus, the dissolved $SiO_2$ is in the form of silica having an average primary particle diameter of less than 1 nm or a silicate anion, and the silicate anion is in the form of, for example, a silicate ion monomer, a silicate ion dimer, or a colloidal silicate ion micelle. Any of these are dissolved in the polishing composition.

The dissolved $SiO_2$ may be present in the form of a silicate anion.

The oligomeric silica or silicate anion forming the dissolved $SiO_2$ may contain a cation serving as a counter ion.

The dissolved $SiO_2$ present together with silica particles preferably contains a certain amount of an alkalinity-providing cation, and the dissolved $SiO_2$ and the alkaline cation form an alkali silicate. In the present invention, silica abrasive grains (silica particles) and water are derived from the aqueous silica sol. The post-polishing composition of the present invention can be produced by addition of the alkali silicate to the aqueous silica sol.

The cation contained in the polishing composition can be regarded as the sum of the cation derived from the alkali silicate and the cation derived from a hydroxide or a carbonate.

The aforementioned dissolved $SiO_2$ is derived from an alkali silicate containing tetraalkylammonium silicate, potassium silicate, sodium silicate, or a mixture of any of these. The post-polishing composition of the present invention may contain a portion of dissolved silica particles serving as abrasive grains. The post-polishing composition of the present invention may contain the dissolved $SiO_2$ such that the mass ratio of $SiO_2$ dissolved in the post-polishing composition to $SiO_2$ of the silica particles is 0.100 to 1.500:1. In particular, tetraalkylammonium silicate is preferably used. The ratio of tetraalkylammonium silicate to another silicate may be 1:0 to 0.8, or 1:0 to 0.5, or 1:0 to 0.35.

From the viewpoint of the polishing property of the polishing composition used for elimination of a laser mark of a silicon wafer, the mass ratio of the tetraalkylammonium ion to silica particles serving as abrasive grains; i.e., (tetraalkylammonium ion)/($SiO_2$ of the silica particles) is preferably 0.400 to 1.500, and the mass ratio of the dissolved $SiO_2$ to the silica particles; i.e., (dissolved $SiO_2$)/($SiO_2$ of the silica particles) is preferably 0.100 to 1.500.

The post-polishing composition of the present invention can be produced by mixing an aqueous silica sol with an alkali silicate. If necessary, the polishing composition may contain, for example, a hydroxide, a carbonate, a sulfate, and a halide.

The alkali silicate may be, for example, tetraalkylammonium silicate, potassium silicate, sodium silicate, or a mixture of any of these.

Examples of the hydroxide include tetraalkylammonium hydroxide, potassium hydroxide, and sodium hydroxide.

Examples of the carbonate include tetraalkylammonium carbonate, potassium carbonate, and sodium carbonate.

Examples of the sulfate include tetraalkylammonium sulfate, potassium sulfate, and sodium sulfate.

Examples of the halide include tetraalkylammonium chloride, tetraalkylammonium bromide, potassium chloride, potassium bromide, sodium chloride, and sodium bromide.

The aforementioned alkali silicate can be produced by mixing an aqueous silica sol with tetraalkylammonium hydroxide, potassium hydroxide, sodium hydroxide, or a mixture of any of these, and heating the resultant mixture at 40° C. to 100° C. for 0.5 hours to 20 hours. The post-polishing composition of the present invention is produced through these steps of producing the alkali silicate.

The production of the tetraalkylammonium silicate will now be described by taking tetraethylammonium silicate as an example, in which it can be produced by heating an aqueous silica sol having a silica concentration of 5.0% by mass to 50% by mass and an alkali content (Na content) of 0.0001% by mass to 0.5000% by mass and an aqueous tetraethylammonium hydroxide solution (concentration: 5.0% by mass to 35% by mass) at 60° C. to 100° C. for two hours to 10 hours. The aforementioned heating can be performed with stirring by using a stirring apparatus such as a disper.

The tetraalkylammonium silicate can be produced so as to achieve a ratio by mole in terms of $SiO_2/MOH$ of 1 to 3, typically 1.5. The aforementioned M represents a tetramethylammonium ion, a tetraethylammonium ion, a tetrapropylammonium ion, a tetrabutylammonium ion, an ethyltrimethylammonium ion, a diethyldimethylammonium ion, or a methyltriethylammonium ion. The $SiO_2$ concentration is 1.0% by mass to 20% by mass, typically 10% by mass, and the tetraalkylammonium hydroxide concentration is 1.0% by mass to 20% by mass, typically 16% by mass. The solid content is 2.0% by mass to 40% by mass, typically 20% by mass.

The production of the alkali metal silicate will now be described by taking potassium silicate as an example, in which it can be produced by heating an aqueous silica sol having a silica concentration of 5.0% by mass to 50% by mass and an alkali content (Na content) of 0.0001% by mass to 0.5000% by mass and an aqueous potassium hydroxide solution (concentration: 2.0% by mass to 48% by mass) at 60° C. to 100° C. for two hours to 10 hours. For the aforementioned production, the aqueous silica sol is heated at 40° C. to 50° C. for 0.5 hours to one hour before addition of the aqueous potassium hydroxide solution, the aqueous potassium hydroxide solution is added to the aqueous silica sol at the temperature, and then the resultant mixture is heated at 90° C. to 100° C. for two hours to 10 hours. The aforementioned heating can be performed with stirring by using a stirring apparatus such as a disper.

The alkali metal silicate can be produced so as to achieve a ratio by mole in terms of $SiO_2/M_2O$ of 2 to 5, typically 3.85. The aforementioned M represents a potassium ion or a sodium ion. The $SiO_2$ concentration is 2.0% by mass to 30% by mass, typically 20% by mass, and the potassium hydroxide concentration is 1.0% by mass to 30% by mass, typically 9.7% by mass. The solid content is 3.0/o by mass to 60% by mass, typically 30% by mass.

The aforementioned silica particles are silica particles derived from the aqueous silica sol. An alkaline component, a water-soluble compound, and a chelating agent may be added, as appropriate, to the silica sol to thereby prepare a polishing liquid.

A water-soluble compound may be used. The water-soluble polymer used may be a water-soluble polymer having an average molecular weight of 5,000 to 2,000,000 and containing an amino group, a hydroxyl group, a sulfonate group, or a carboxyl group in the molecule.

The water-soluble polymer used may be, for example, poly-N-vinylacetamide, polyvinylpyrrolidone, polyvinyl alcohol, hydroxyethyl cellulose, hydroxypropyl cellulose, hydroxymethyl propyl cellulose, or carboxymethyl cellulose. The post-polishing composition of the present invention may contain a water-soluble polymer such that the mass ratio of the water-soluble polymer to $SiO_2$ of the silica particles is 0.005 to 0.05:1.

The post-polishing composition of the present invention may contain a chelating agent. Examples of the chelating agent include an aminocarboxylic acid chelating agent and a phosphonic acid chelating agent.

Examples of the aminocarboxylic acid chelating agent include ethylenediaminetetraacetic acid, nitrilotriacetic acid, diethylenetriaminepentaacetic acid, hydroxyethylethylenediaminetriacetic acid, triethylenetetraminehexaacetic acid, 1,3-propanediaminetetraacetic acid, 1,3-diamino-2-hydroxypropanetetraacetic acid, hydroxyethyliminodiacetic acid, dihydroxyethylglycine, glycol ether diaminetetraacetic acid, dicarboxymethylglutamic acid, and ethylenediamine-N,N'-disuccinic acid.

Examples of the phosphonic acid chelating agent include hydroxyethylidenediphosphonic acid, nitrilotris(methylenephosphonic acid), phosphonobutanetricarboxylic acid, and ethylenediaminetetra(methylenephosphonic acid).

The chelating agent may be contained in an amount of 0.005% by mass to 1.0% by mass relative to the post-polishing composition of the present invention.

The present invention is also directed to a polishing method including the following step (A) and step (B):

step (A): a step of polishing a silicon wafer with a primary polishing composition containing silica particles, water, and a basic compound; and step (B): a step of polishing the silicon wafer with the post-polishing composition of the present invention according to any one of claims 1 to 10 in place of the polishing composition used in the step (A). A silicon wafer can be polished by this method.

Typically, the polishing can be performed by a method wherein the step (A) and the step (B) are performed in the same polishing apparatus; the polishing composition is supplied by a circulation polishing process in the step (A), and by a circulation polishing process or a pouring polishing process in the step (B); and the polishing time in the step (B) is ½ or less, or ¼ or less, or ¹⁄₁₀ or less (typically ¼ to ¹⁄₁₀) of the polishing time in the step (A).

The pouring polishing process in the step (B) corresponds to a polishing process wherein, when a silicon wafer subjected to the step (A) with the polishing apparatus is polished in the step (B) with the polishing apparatus, a polishing liquid containing the post-polishing composition used in the step (B) is supplied in a one-pass mode, rather than a circulation mode.

Thus, the step (A) mainly involves rough polishing of a portion around the center of a silicon wafer with a polishing liquid containing a primary polishing composition supplied in a circulation mode, and the step (B) involves polishing of a laser mark portion present at the periphery of the silicon wafer with a polishing liquid containing the post-polishing composition containing a specific amount of a water-soluble polymer and exhibiting high affinity to the laser mark portion. The polishing of both the center and periphery of the silicon wafer can be completed by this rough polishing process.

This rough polishing process may be followed by a subsequent final polishing process.

In the case where a protrusion of a laser mark is not sufficiently eliminated by the aforementioned rough polishing process, the protrusion of the laser mark cannot be eliminated even by the final polishing process and remains on the silicon wafer, which is not preferred.

Examples of the wafer to which the post-polishing composition for wafers of the present invention can be applied include silicon wafer, SiC wafer, GaN wafer, GaAs wafer, GaP wafer, glass wafer, aluminum wafer, and sapphire wafer.

The polishing apparatus used for polishing of the wafer is of a single-side polishing type or a double-side polishing type. The post-polishing composition for wafers of the present invention can be used in any of these types of apparatuses.

The use of the post-polishing composition of the present invention for a wafer polishing process can produce a wafer having a flat polished surface wherein the difference in level is small between the center of the wafer and the periphery (laser mark portion) of the wafer.

The post-polishing composition of the present invention can be used to polish a protrusion around a laser mark on a laser mark-provided wafer.

In the present invention, a step of preliminarily polishing a laser mark-provided wafer can be followed by a step of polishing a protrusion around a laser mark on the laser mark-provided wafer by using the post-polishing composition of the present invention.

Thus, a laser-mark-around protrusion having a height of 50 nm to 500 nm or 50 nm to 200 nm as measured from the horizontal surface of the wafer can be polished so as to have a height of 30 nm to −10 nm, preferably 25 nm to 0 nm, more preferably 0 nm, as measured from the horizontal surface. A height of about −10 nm of the polished laser-mark-around protrusion is attributed to the state where the laser-mark-around protrusion is polished and scraped down toward a laser mark dent so as to have a height of about −10 nm. Such a negative value is due to polishing of the edge of the dent, and the height is ideally and preferably 0 nm.

EXAMPLES (Synthesis Example 1) Synthesis of TEA Silicate (Tetraethylammonium Silicate)

A silica sol having a silica concentration of 35% by mass was subjected to ion exchange with a cation exchange resin (Amberlite IR-120B, available from Organo Corporation), and 2,580 g of ion-exchange water was added to 2.860 g of the resultant acidic silica sol (alkali content: 0.03% by mass), followed by addition of 4,560 g of 35% aqueous tetraethylammonium hydroxide (TEAH) solution with stirring. The resultant solution was heated to 80° C. with stirring and then retained for six hours, to thereby prepare a desired TEA silicate solution.

The resultant TEA silicate was found to have a mole in terms of $SiO_2$/TEAH of 1.5, an $SiO_2$ concentration of 10% by mass, and a tetraethylammonium hydroxide concentration of 16% by mass.

(Preparation of Rough Polishing Composition (Primary Polishing Composition))

There was produced a rough polishing composition containing 0.80% by mass of colloidal silica having an average primary particle diameter of 45 nm as determined by the nitrogen adsorption method (BET method) (silica abrasive grains, trade name: Snowtex (silica particles based on silica sol), available from Nissan Chemical Corporation), 0.24% by mass of tetramethylammonium hydroxide, 0.30% by mass of potassium carbonate, 0.02% by mass of ethylenediaminetetraacetic acid tetrasodium salt, 0.03% by mass of glycerin, and water (balance). The pH of the composition was about 10.8.

(Preparation of Post-Polishing Composition after Primary Polishing)

Examples 1 to 9 and Comparative Examples 1 to 5

There was produced a post-polishing composition containing colloidal silica having an average primary particle diameter of 45 nm as determined by the nitrogen adsorption method (BET method) (silica abrasive grains, trade name: Snowtex (silica particles based on silica sol), available from Nissan Chemical Corporation), the TEA silicate prepared in the aforementioned Synthesis Example, ethylenediaminetetraacetic acid tetrasodium salt, a water-soluble polymer, and water (balance). In each composition, the amount of silica abrasive grains (silica particles) was 0.5% by mass, and the amount of ethylenediaminetetraacetic acid tetrasodium salt was 0.013% by mass.

Tables 1 and 2 show the amount (% by mass) of a silica component dissolved in the resultant post-polishing composition, the amount (% by mass) of tetraethylammonium cation (TEA) contained in the composition, the type and molecular weight of a water-soluble polymer, the amount (% by mass) of the polymer contained in the composition, and the pH of the composition.

In Table 1, PNVA denotes "poly-N-vinylacetamide"; PVP, "polyvinylpyrrolidone"; PVA, "polyvinyl alcohol"; and HPC, "hydroxypropyl cellulose."

TABLE 1

| | Dissolved $SiO_2$ content Mass ratio of (dissolved $SiO_2$)/ ($SiO_2$ of silica particles) | TEA content Mass ratio of (TEA)/($SiO_2$ of silica particles) |
|---|---|---|
| Example 1 | 0.5 | 0.72 |
| Example 2 | 0.5 | 0.72 |
| Example 3 | 0.5 | 0.72 |
| Example 4 | 0.16 | 0.24 |
| Example 5 | 0.5 | 0.72 |
| Example 6 | 0.5 | 0.72 |
| Example 7 | 0.5 | 0.72 |
| Example 8 | 0.5 | 0.72 |
| Example 9 | 0.5 | 0.72 |
| Comparative Example 1 | 0.5 | 0.72 |
| Comparative Example 2 | 0.06 | 0.08 |
| Comparative Example 3 | 0.76 | 1.04 |
| Comparative Example 4 | 0.5 | 0.72 |
| Comparative Example 5 | 0.5 | 0.72 |

TABLE 2

| | Water-soluble polymer | | | |
|---|---|---|---|---|
| | Type | Molecular weight | Amount (mass ratio) (water-soluble polymer)/ (SiO$_2$ of silica particles) | pH of composition |
| Example 1 | PNVA | 300000 | 0.01 | 10.8 |
| Example 2 | PNVA | 300000 | 0.02 | 10.8 |
| Example 3 | PNVA | 300000 | 0.04 | 10.8 |
| Example 4 | PNVA | 300000 | 0.02 | 10.4 |
| Example 5 | PNVA | 50000 | 0.02 | 10.8 |
| Example 6 | PNVA | 1800000 | 0.02 | 10.8 |
| Example 7 | PVP | 10000 | 0.02 | 10.8 |
| Example 8 | PVA | 20000 | 0.02 | 10.8 |
| Example 9 | HPC | 100000 | 0.02 | 10.8 |
| Comparative Example 1 | None | | | 10.9 |
| Comparative Example 2 | PNVA | 300000 | 0.02 | 10.2 |
| Comparative Example 3 | PNVA | 300000 | 0.02 | 11.0 |
| Comparative Example 4 | PNVA | 300000 | 0.002 | 10.8 |
| Comparative Example 5 | PNVA | 300000 | 0.06 | 10.8 |

(Primary Polishing Process)

The primary polishing (rough polishing) was performed with the aforementioned primary polishing composition under the conditions described below. The wafer to be polished was a single-crystal silicon wafer having a diameter of 200 mm. P-type conduction, a crystal orientation defined by the Miller index <100>, and a resistivity of 100 Ω·cm or less. The primary polishing composition was supplied in a circulation mode, and the liquid temperature of the primary polishing composition was 23 to 25° C.

(Primary Polishing Conditions)

Polishing machine: double-side polishing machine 13BF, available from HAMAI CO., LTD.
Polishing pad: LP-57, available from JH RHODES, groove width: 2 mm, groove pitch: 20 mm
Polishing load: 150 g/cm$^2$
Rotation speed of lower surface plate: 6.6 rpm
Rotation speed of upper surface plate: 20 rpm
Rotation speed ratio: 3.3
Number of wafers polished: one wafer/carrier, three sets (total: three wafers) were simultaneously polished
Amount of primary polishing composition supplied: 6.4 L/min
Polishing time: 60 min (Post-Polishing Process after Primary Polishing)

The wafer obtained through the aforementioned primary polishing process was subjected to post-polishing with the aforementioned post-polishing composition under the polishing conditions described below. The post-polishing composition was supplied in a circulation mode, and the liquid temperature of the post-polishing composition was 23 to 25° C.

(Post-Polishing Conditions after Primary Polishing)

Polishing machine: double-side polishing machine 13BF, available from HAMAI CO., LTD.
Polishing pad: LP-57, available from JH RHODES, groove width: 2 mm, groove pitch: 20 mm
Polishing load: 150 g/cm$^2$
Rotation speed of lower surface plate: 6.6 rpm
Rotation speed of upper surface plate: 20 rpm
Rotation speed ratio: 3.3
Number of wafers polished: one wafer/carrier, three sets (total: three wafers) were simultaneously polished
Amount of post-polishing composition supplied: 6.4 L/min
Polishing time: 5 min (Results of Post-Polishing Test)

The results of the post-polishing test are shown in Table 3. "Laser mark eliminability" corresponds to the height of a laser mark neighborhood (height (nm) as measured from the silicon wafer) after the post-polishing. A height of 10 nm or less was regarded as "pass." Also shown is a rate of improvement in surface roughness as compared with the wafer after the primary polishing. A negative value of the rate of improvement indicates deterioration of the surface roughness.

For measurement of the height of a laser mark neighborhood, an optical interference microscope system BW-M7000 (trade name) available from NIKON INSTECH CO., LTD. was used to measure the highest portion on the surface of the wafer with respect to a roughness curve prepared by scanning of a constant width (500 μm). For measurement of the surface roughness, an optical interference microscope system BW-M7000 (trade name) available from NIKON INSTECH CO., LTD. was used to measure the root mean square height in a 111 μm square region at the center of the wafer.

Each of the post-polishing compositions of the Examples, which contain specific amounts of a dissolved silica component and a water-soluble polymer, was found to exhibit excellent laser mark eliminability and a high effect of improving the surface roughness. The results are thought to be attributed to the fact that the dissolved silica component changed the wettability of the composition with respect to a laser mark portion, and thus the composition polished the laser mark portion more effectively, and that the water-soluble polymer was preferentially adsorbed on the wafer surface that was concave relative to the laser mark portion, and thus the protrusion of the laser mark was effectively polished. Furthermore, it is considered that adsorption of the water-soluble polymer on the wafer prevented excessive etching of the wafer with an alkali, resulting in achievement of a polished surface having superior surface roughness.

Meanwhile, each of the compositions of the Comparative Examples, which do not contain specific amounts of a dissolved silica component and a water-soluble polymer, did not appropriately exhibit the aforementioned effects, which probably resulted in impaired laser mark eliminability and deterioration of surface roughness.

TABLE 3

| | Laser mark eliminability (nm) | Rate of improvement in surface roughness (%) |
|---|---|---|
| Example 1 | 6 | 2 |
| Example 2 | 5 | 13 |
| Example 3 | 5 | 10 |
| Example 4 | 7 | 25 |
| Example 5 | 9 | 10 |
| Example 6 | 4 | 19 |
| Example 7 | 7 | 19 |
| Example 8 | 5 | 9 |
| Example 9 | 9 | 30 |
| Comparative Example 1 | 41 | −13 |
| Comparative Example 2 | 17 | 39 |
| Comparative Example 3 | 22 | 17 |
| Comparative Example 4 | 32 | −6 |
| Comparative Example 5 | 21 | 26 |

INDUSTRIAL APPLICABILITY

The use of the post-polishing composition of the present invention in a wafer polishing process can eliminate a protrusion around a laser mark, to thereby achieve a flat polished surface and a wafer having excellent surface roughness.

The invention claimed is:

1. A post-polishing composition for elimination of a laser mark remaining after polishing of a silicon wafer with a primary polishing composition, the post-polishing composition comprising silica particles, water, a tetraalkylammonium ion, and a water-soluble polymer, wherein the mass ratio of the tetraalkylammonium ion to $SiO_2$ of the silica particles is 0.200 to 1.000:1; the mass ratio of $SiO_2$ dissolved in the post-polishing composition to $SiO_2$ of the silica particles is 0.100 to 1.500:1; and the mass ratio of the water-soluble polymer to $SiO_2$ of the silica particles is 0.005 to 0.05:1.

2. The post-polishing composition according to claim 1, wherein the tetraalkylammonium ion is derived from a compound selected from the group consisting of an alkali silicate, a hydroxide, a carbonate, a sulfate, and a halide, and the tetraalkylammonium ion is contained in the post-polishing composition in an amount of 0.2% by mass to 8.0% by mass.

3. The post-polishing composition according to claim 1, wherein the dissolved $SiO_2$ is derived from tetraalkylammonium silicate, potassium silicate, sodium silicate, or a mixture of any of these, and the dissolved $SiO_2$ is contained in the post-polishing composition in an amount of 0.1% by mass to 8.0% by mass.

4. The post-polishing composition according to claim 1, wherein the dissolved $SiO_2$ is silica having an average primary particle diameter of less than 1 nm, or a silicate anion.

5. The post-polishing composition according to claim 1, wherein the tetraalkylammonium ion is a tetramethylammonium ion, a tetraethylammonium ion, a tetrapropylammonium ion, a tetrabutylammonium ion, an ethyltrimethylammonium ion, a diethyldimethylammonium ion, a methyltriethylammonium ion, or a mixture of any of these.

6. The post-polishing composition according to claim 1, wherein the silica particles have an average primary particle diameter of 1 nm to 100 nm, and the post-polishing composition has a silica concentration based on the silica particles of 0.1% by mass to 30% by mass.

7. The post-polishing composition according to claim 1, wherein the post-polishing composition has a pH of 9 to 13.

8. The post-polishing composition according to claim 1, wherein the water-soluble polymer has an average molecular weight of 5,000 to 2,000,000 and contains an amino group, a hydroxyl group, a sulfonate group, or a carboxyl group in the molecule.

9. The post-polishing composition according to claim 8, wherein the water-soluble polymer is poly-N-vinylacetamide, polyvinylpyrrolidone, polyvinyl alcohol, hydroxyethyl cellulose, hydroxypropyl cellulose, hydroxymethyl propyl cellulose, or carboxymethyl cellulose.

10. The post-polishing composition according to claim 1, wherein the polishing is for elimination of a laser mark of a silicon wafer.

11. A silicon wafer polishing method comprising the following step (A) and step (B):
step (A): a step of polishing a silicon wafer with a primary polishing composition containing silica particles, water, and a basic compound; and
step (B): a step of polishing the silicon wafer with the post-polishing composition according to claim 1 in place of the polishing composition used in the step (A).

12. The polishing method according to claim 11, wherein the step (A) and the step (B) are performed in the same polishing apparatus; the polishing composition is supplied by a circulation polishing process in the step (A), and by a circulation polishing process or a pouring polishing process in the step (B); and the polishing time in the step (B) is ½ or less of the polishing time in the step (A).

* * * * *